United States Patent
Pae et al.

(10) Patent No.: US 9,728,486 B2
(45) Date of Patent: Aug. 8, 2017

(54) SEMICONDUCTOR DEVICE INCLUDING A FIN PATTERN

(71) Applicants: Sang-Woo Pae, Seongnam-si (KR); Jong-Wook Jeon, Suwon-si (KR); Seung-Jin Choo, Suwon-si (KR); Hyun-Chul Sagong, Hwaseong-si (KR); Jae-Hee Choi, Seoul (KR)

(72) Inventors: Sang-Woo Pae, Seongnam-si (KR); Jong-Wook Jeon, Suwon-si (KR); Seung-Jin Choo, Suwon-si (KR); Hyun-Chul Sagong, Hwaseong-si (KR); Jae-Hee Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/961,259

(22) Filed: Dec. 7, 2015

(65) Prior Publication Data

US 2016/0233144 A1    Aug. 11, 2016

(30) Foreign Application Priority Data

Feb. 6, 2015    (KR) .......................... 10-2015-0018562

(51) Int. Cl.
*H01L 23/373*    (2006.01)
*H01L 29/10*    (2006.01)
*H01L 27/088*    (2006.01)
(Continued)

(52) U.S. Cl.
CPC .. *H01L 23/3738* (2013.01); *H01L 21/823431* (2013.01); *H01L 23/367* (2013.01);
(Continued)

(58) Field of Classification Search
CPC ...... H01L 21/0257–21/02584; H01L 21/0415; H01L 21/046–21/047; H01L 21/2253; H01L 21/265–21/266; H01L 21/3115–21/31155; H01L 21/3215–21/32155;
(Continued)

(56) References Cited

U.S. PATENT DOCUMENTS 8,710,549 B2    4/2014    Huang et al.
2007/0010049 A1    1/2007    Anderson et al.
(Continued)

FOREIGN PATENT DOCUMENTS

JP    2009-021456 A    1/2009
JP    2010-093012 A    4/2010
(Continued)

*Primary Examiner* — Scott B Geyer
(74) *Attorney, Agent, or Firm* — Myers Bigel, P.A.

(57) ABSTRACT

A semiconductor device includes a first fin pattern, which includes a first lower pattern and a first upper pattern stacked sequentially on a substrate, the first upper pattern including a first part and second parts respectively disposed on both sides of the first part, a gate electrode, which is formed on the first part to intersect the first fin pattern, and source/drain regions, which are formed on the second parts, respectively. A dopant concentration of the first upper pattern is higher than a dopant concentration of the first lower pattern and a dopant concentration of the substrate, and the dopant concentration of the first lower pattern is different from the dopant concentration of the substrate.

12 Claims, 23 Drawing Sheets

(51) Int. Cl.
*H01L 23/367* (2006.01)
*H01L 29/36* (2006.01)
*H01L 21/8234* (2006.01)

(52) U.S. Cl.
CPC ........ *H01L 27/0886* (2013.01); *H01L 29/105* (2013.01); *H01L 29/1041* (2013.01); *H01L 29/36* (2013.01)

(58) Field of Classification Search
CPC .......... H01L 21/425–21/426; H01L 21/76825; H01L 21/76859; H01L 21/7686; H01L 21/823431; H01L 21/823821; H01L 21/845; H01L 27/0886; H01L 27/0924; H01L 27/10826; H01L 27/10879; H01L 27/1211; H01L 29/41791; H01L 29/66795–29/66818; H01L 29/785–29/7856; H01L 2924/13067
See application file for complete search history.

(56) References Cited

U.S. PATENT DOCUMENTS

| | | |
|---|---|---|
| 2010/0248454 A1 | 9/2010 | Maszara et al. |
| 2013/0330916 A1 | 12/2013 | Pham et al. |
| 2014/0054648 A1 | 2/2014 | Itokawa et al. |
| 2014/0087547 A1 | 3/2014 | Miyano et al. |
| 2015/0318397 A1* | 11/2015 | Zhu ................ H01L 21/823431 257/192 |

FOREIGN PATENT DOCUMENTS

| | | |
|---|---|---|
| JP | 2014-038898 A | 2/2014 |
| JP | 2014-063929 A | 4/2014 |
| KR | 10-2005-0006836 A | 1/2005 |
| KR | 10-2005-0055978 A | 6/2005 |

* cited by examiner

SEMICONDUCTOR DEVICE INCLUDING A FIN PATTERN

This application claims priority from Korean Patent Application No. 10-2015-0018562 filed on Feb. 6, 2015 in the Korean Intellectual Property Office, the disclosure of which is incorporated herein by reference in its entirety.

BACKGROUND

1. Technical Field

The present inventive concept relates to a semiconductor device, and more particularly, to a semiconductor device including a fin pattern.

2. Description of the Related Art

One of the scaling techniques for increasing the density of a semiconductor device involves the use of a multi-gate transistor. The multi-gate transistor is obtained by forming a fin- or nanowire-shaped multi-channel active pattern (or silicon body) on a substrate and forming a gate on the surface of the silicon body.

The multi-gate transistor can be easily scaled because it uses a three-dimensional (3D) channel. In addition, the current control capability can be improved without the need to increase the gate length of the multi-gate transistor. Moreover, it is possible to effectively suppress a short channel effect (SCE) in which an electric potential of a channel region is affected by a drain voltage.

SUMMARY

Aspects of the present inventive concept provide a semiconductor device, which can improve operating performance and reliability by facilitating the dissipation of heat generated in a transistor.

However, aspects of the present inventive concept are not restricted to the ones set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a semiconductor device comprising a first fin pattern including a first lower pattern and a first upper pattern stacked sequentially on a substrate, the first upper pattern including a first part and second parts respectively disposed on sides of the first part, a gate electrode formed on the first part to intersect the first fin pattern, and source/drain regions formed on the second parts, respectively, wherein a dopant concentration of the first upper pattern is greater than a dopant concentration of the first lower pattern and a dopant concentration of the substrate, and the dopant concentration of the first lower pattern is different from the dopant concentration of the substrate.

In some embodiments of the present inventive concept, the dopant concentration of the first lower pattern is substantially constant along a thickness direction of the first lower pattern.

In some embodiments of the present inventive concept, the dopant concentration of the first lower pattern is greater than the dopant concentration of the substrate.

In some embodiments of the present inventive concept, the first lower pattern comprises an undoped semiconductor pattern.

In some embodiments of the present inventive concept, the dopant concentration of the first lower pattern varies along the thickness direction of the first lower pattern.

In some embodiments of the present inventive concept, the dopant concentration of the first lower pattern increases as a distance from the substrate increases.

In some embodiments of the present inventive concept, the first lower pattern comprises a part having a lower dopant concentration than the substrate.

In some embodiments of the present inventive concept, the first lower pattern comprises an undoped region.

In some embodiments of the present inventive concept, the semiconductor device may further comprise an insertion layer formed between the substrate and the first fin pattern, which is directly connected to the first lower pattern, and has a substantially constant dopant concentration along a thickness direction. The dopant concentration of the insertion layer is different from the dopant concentration of the substrate, lower than the dopant concentration of the first upper pattern, and substantially equal to the dopant concentration of the first lower pattern.

In some embodiments of the present inventive concept, the semiconductor device may further comprise a second fin pattern formed on the substrate and comprises a second lower pattern directly connected to the insertion layer and a second upper pattern disposed on the second lower pattern. A dopant concentration of the second upper pattern is greater than a dopant concentration of the second lower pattern and the dopant concentration of the substrate, and the dopant concentration of the second lower pattern is different from the dopant concentration of the substrate.

In some embodiments of the present inventive concept, the dopant concentration of the first lower pattern is substantially equal to the dopant concentration of the second lower pattern.

In some embodiments of the present inventive concept, the insertion layer is wider than the first lower pattern in a direction parallel to the substrate.

In some embodiments of the present inventive concept, the semiconductor may further comprise an insertion layer formed between the substrate and the first fin pattern and is directly connected to the first lower pattern. The insertion layer and the first lower pattern comprises the same dopant, and a dopant concentration of the insertion layer is less than the dopant concentration of the first upper pattern, and the dopant concentration of the insertion layer and the dopant concentration of the first lower pattern increase as the distance from the substrate increases.

In some embodiments of the present inventive concept, the first upper pattern and the first lower pattern have the same conductivity type.

In some embodiments of the present inventive concept, the semiconductor may further comprise a field insulating layer formed on the substrate. The field insulating layer entirely covers sidewalls of the first lower pattern.

In some embodiments of the present inventive concept, each of the source/drain regions comprises an epitaxial layer formed along a profile of one of the second parts.

In some embodiments of the present inventive concept, a height from the substrate to a top surface of the first part is greater than a height from the substrate to a top surface of each of the second parts, and each of the source/drain regions comprises an epitaxial layer which is formed on the top surfaces of respective ones of the second parts.

In some embodiments of the present inventive concept, the first upper pattern and the first lower pattern include the same material.

According to another aspect of the present inventive concept, there is provided a semiconductor device comprising a heat-conducting layer which is formed on a substrate and includes a base layer, a first protruding pattern and a second protruding pattern, each of the first protruding pattern and the second protruding pattern protruding from the base layer, a field insulating layer disposed on the base layer and entirely covers sidewalls of the first protruding pattern and sidewalls of the second protruding pattern, a first upper pattern disposed on the first protruding pattern and protrudes farther upward than a top surface of the field insulating layer, a second upper pattern disposed on the second protruding pattern and protrudes father upward than the top surface of the field insulating layer, and a gate electrode formed on the field insulating layer to intersect the first upper pattern and the second upper pattern, wherein a dopant concentration of the first upper pattern and a dopant concentration of the second upper pattern are greater than a dopant concentration of the heat-conducting layer and a dopant concentration of the substrate.

In some embodiments of the present inventive concept, the dopant concentration of the heat-conducting layer is substantially constant along a thickness direction of the heat-conducting layer.

In some embodiments of the present inventive concept, the dopant concentration of the heat-conducting layer is greater than the dopant concentration of the substrate.

In some embodiments of the present inventive concept, the heat-conducting layer comprises an undoped epitaxial layer.

In some embodiments of the present inventive concept, the dopant concentration of the heat-conducting layer increases as a distance from the substrate increases.

In some embodiments of the present inventive concept, the base layer comprises an undoped region.

In some embodiments of the present inventive concept, the heat-conducting layer comprise a material having a thermal conductivity greater than the first upper pattern and the second upper pattern.

In some embodiments of the present inventive concept, the heat-conducting layer, the first upper pattern, and the second upper pattern comprise the same material.

In some embodiments of the present inventive concept, the first protruding pattern and the second protruding pattern are disposed directly on the base layer.

According to still another aspect of the present inventive concept, there is provided a semiconductor device comprising a heat-conducting layer on a substrate, a dopant concentration of the heat-conducting layer increasing as a distance from the substrate increases, a fin pattern formed on the heat-conducting layer and directly connected to the heat-conducting layer, at least part of the fin pattern protruding farther upward than a field insulating layer formed on the substrate, and a gate electrode formed on a field insulating layer to intersect the fin pattern, wherein the dopant concentration of the heat-conducting layer is less than a dopant concentration of the fin pattern in a boundary region between the fin pattern and the heat-conducting layer.

In some embodiments of the present inventive concept, the heat-conducting layer comprises an undoped epitaxial layer disposed in a region closest to the substrate.

In some embodiments of the present inventive concept, the heat-conducting layer comprises a base layer and a protruding pattern that protrudes from the base layer in a direction away from the substrate, and the field insulating layer covers sidewalls of the protruding pattern.

In some embodiments of the present inventive concept, the field insulating layer is formed on the base layer.

In some embodiments of the present inventive concept, the heat-conducting layer is fin-shaped, and the field insulating layer entirely covers sidewalls of the heat-conducting layer.

According to still another aspect of the present inventive concept, there is provided a semiconductor device comprising a substrate including a first area in which an n-channel metal oxide semiconductor (NMOS) is formed and a second area in which ap-channel metal oxide semiconductor (PMOS) is formed, a first transistor which is formed in the first area, and a second transistor which is formed in the second area, wherein the first transistor comprises a first fin pattern which comprises a first heat-conducting layer and a first upper pattern stacked sequentially on the substrate and a first gate electrode which is formed on the first upper pattern to intersect the first fin pattern, and the second transistor comprises a second fin pattern, which comprises a second heat-conducting layer and a second upper pattern stacked sequentially on the substrate and a second gate electrode, which is formed on the second upper pattern to intersect the second fin pattern, and wherein at least part of the first upper pattern and at least part of the second upper pattern protrude farther upward than a field insulating layer formed on the substrate, a dopant concentration of the first upper pattern is greater than a dopant concentration of the first heat-conducting layer and a dopant concentration of the substrate, a dopant concentration of the second upper pattern is greater than a dopant concentration of the second heat-conducting layer and the dopant concentration of the substrate, and a dopant concentration profile of the first heat-conducting layer is different from a dopant concentration profile of the second heat-conducting layer.

In some embodiments of the present inventive concept, the dopant concentration of the first heat-conducting layer and the dopant concentration of the second heat-conducting layer are substantially constant along a thickness direction, and the dopant concentration of the first heat-conducting layer is greater than the dopant concentration of the second heat-conducting layer.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
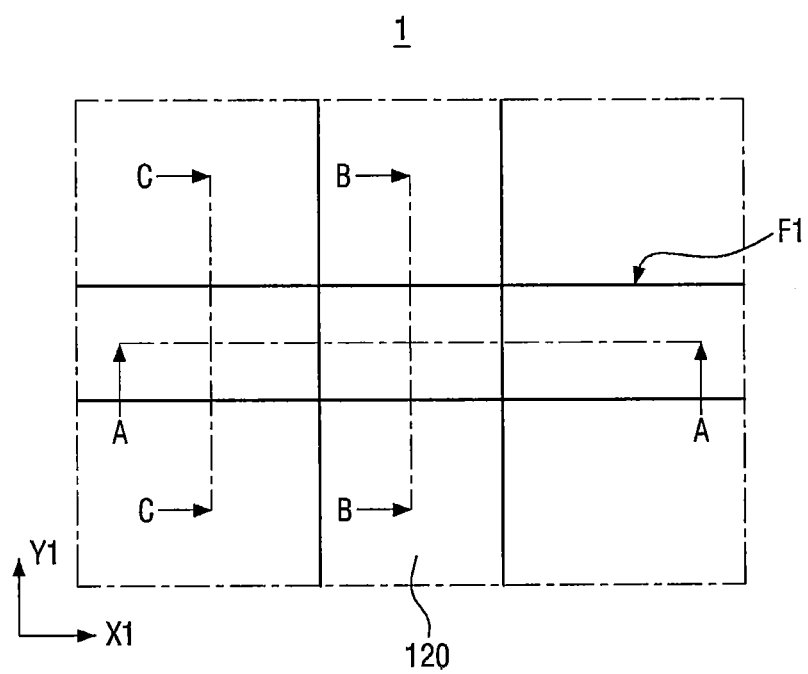
FIG. 1 is a layout view of a semiconductor device according to a first embodiment of the present inventive concept.

The present inventive concept will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

When a certain embodiment may be implemented differently, a specific process order may be performed differently from the described order. For example, two consecutively described processes may be performed substantially at the same time or performed in an order opposite to the described order.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

A semiconductor device according to a first embodiment of the present inventive concept will now be described with reference to FIGS. 1 through 5.

Figure 2:
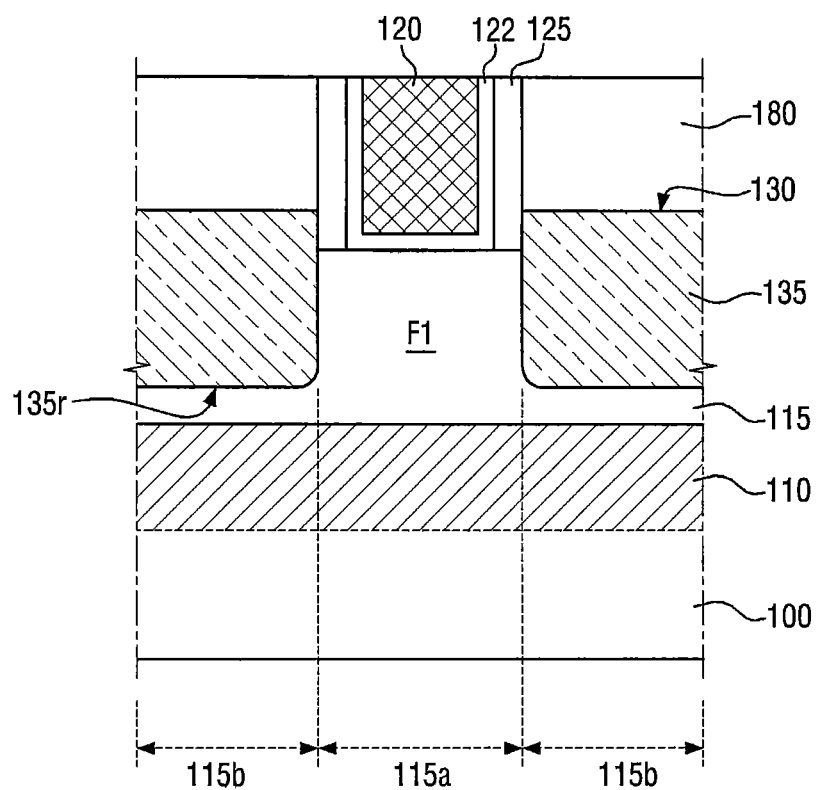
FIG. 2 is a cross-sectional view taken along the line A-A of FIG. 1.
Figure 3:
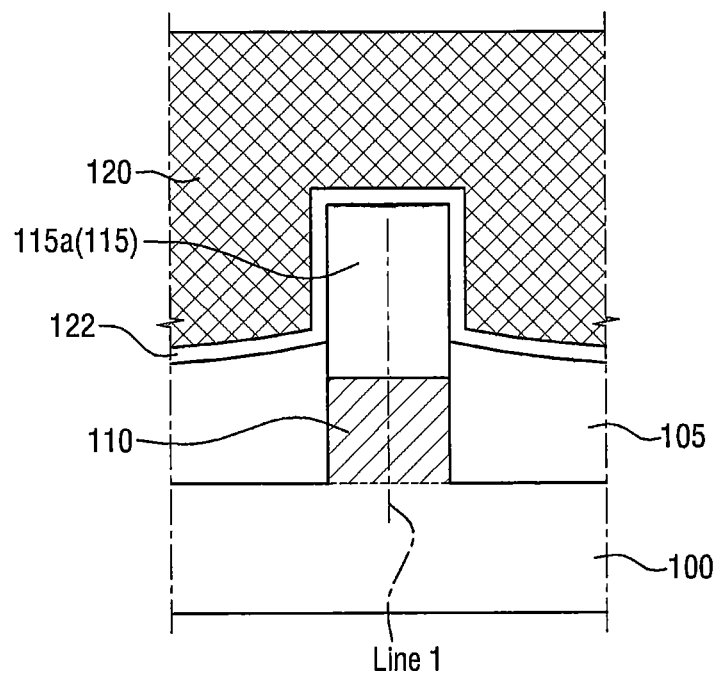
FIG. 3 is a cross-sectional view taken along the line B-B of FIG. 1.
Figure 4:
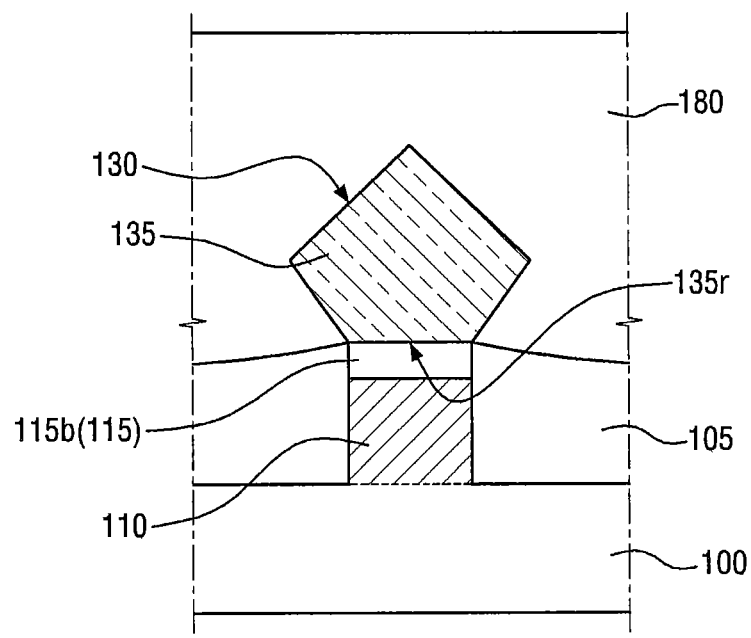
FIG. 4 is a cross-sectional view taken along the line C-C of FIG. 1.
Figure 5:
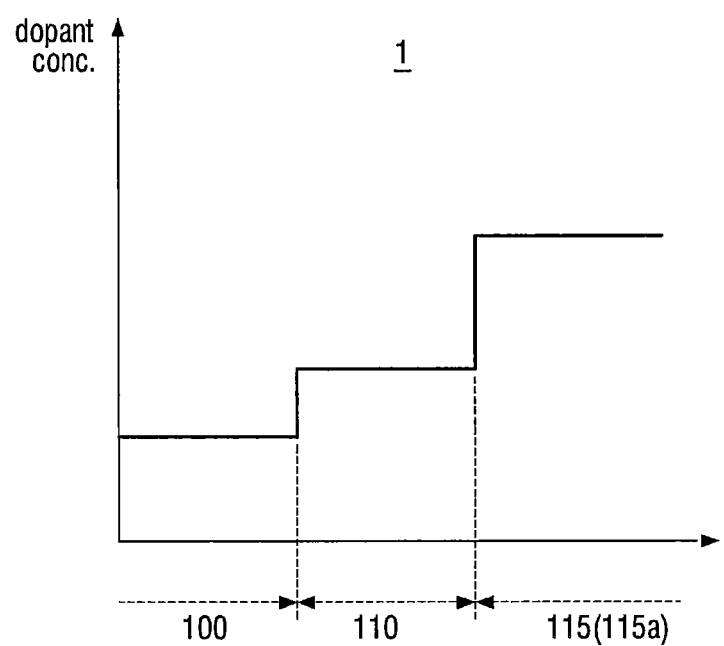
FIG. 5 is a schematic diagram illustrating dopant concentrations along Line 1 of FIG. 3.

FIG. 1 is a layout view of a semiconductor device 1 according to a first embodiment of the present inventive concept. FIG. 2 is a cross-sectional view taken along the line A-A of FIG. 1. FIG. 3 is a cross-sectional view taken along the line B-B of FIG. 1. FIG. 4 is a cross-sectional view taken along the line C-C of FIG. 1. FIG. 5 is a schematic diagram illustrating dopant concentrations along Line 1 of FIG. 3.

Referring to FIGS. 1 through 5, the semiconductor device 1 according to the first embodiment of the present inventive concept may include a first heat-conducting layer 110, a first upper pattern 115, a first gate electrode 120, and first source/drain regions 130.

A substrate 100 may be a bulk silicon substrate or a silicon-on-insulator (SOI) substrate. Otherwise, the substrate 100 may be a silicon substrate or may be a substrate made of another material, such as silicon germanium, indium antimonide, lead telluride, indium arsenide, indium phosphide, gallium arsenide, or gallium antimonide. Alternatively, the substrate 100 may include a base substrate and an epitaxial layer formed on the base substrate.

A first fin pattern F1 may protrude from the substrate 100. A field insulating layer 105 formed on the substrate 100 and may partially cover the first fin pattern F1. Therefore, at least part of the first fin pattern F1 may protrude farther upward than the field insulating layer 105. That is, part of a top surface of the first fin pattern F1 may protrude farther upward than a top surface of the field insulating layer 105.

The first fin pattern F1 may be defined by the field insulating layer 105. The first fin pattern F1 may extend along a first direction X1. The field insulating layer 105 may include one of an oxide layer, a nitride layer, an oxynitride layer, and combinations of the same.

The first fin pattern F1 may include the first heat-conducting layer 110 and the first upper pattern 115 stacked sequentially on the substrate 100. Like the first fin pattern F1, the first heat-conducting layer 110 and the first upper pattern 115 may extend along the first direction X1.

The first upper pattern 115 may be shaped like a fin, that is, a long bar extending along the first direction X1. In addition, in the semiconductor device 1 according to the first embodiment of the present inventive concept, the first heat-conducting layer 110, like the first upper pattern 115, may be shaped like a fin, that is, a long bar extending along the first direction X1.

The first heat-conducting layer 110 may be a lower part of the first fin pattern F1, and the first upper pattern 115 may be an upper part of the first fin pattern F1. For example, the first upper pattern 115 may be directly connected to the first heat-conducting layer 110, but the present disclosure is not limited thereto.

At least part of the first upper pattern 115 may protrude farther upward than the top surface of the field insulating layer 105.

At least part of the first upper pattern 115 may be used as, for example, a channel region of a transistor. During the operation of the semiconductor device 1 according to the first embodiment of the present inventive concept, the first heat-conducting layer 110 may allow heat generated in the channel region to be easily dissipated to the substrate 100, which is described hereinafter.

In FIGS. 2 through 4, a lowest part of the first heat-conducting layer 110 is illustrated as being a lowest part of the first fin pattern F1. However, this is merely an example used for ease of description, and the present disclosure is not limited to this example.

In FIG. 3, the field insulating layer 105 entirely covers sidewalls of the first heat-conducting layer 110. However, this is merely an example used for ease of description, and the present disclosure is not limited to this example.

The first upper pattern 115 may include a first part 115a and second parts 115b. The second parts 115b of the first upper pattern 115 may be disposed on both sides in the first direction X1 with respect to the first part 115a of the first upper pattern 115. That is, the second parts 115b of the first upper pattern 115 may respectively be located on both sides of the first part 115a of the first upper pattern 115.

In the semiconductor device 1 according to the first embodiment of the present inventive concept, a height from the substrate 100 to a top surface of the first part 115a of the first upper pattern 115 may be greater than a height from the substrate 100 to a top surface of each of the second parts 115b of the first upper pattern 115.

That is, the top surface of each of the second parts 115b of the first upper pattern 115 may be more recessed than the top surface of the first part 115a of the first upper pattern 115. The first upper pattern 115 may include a first recess 135r formed in each of the second parts 115b of the first upper pattern 115.

The first fin pattern F1 may be part of the substrate 100 or may include an epitaxial layer grown from the substrate 100. The first heat-conducting layer 110 and the first upper pattern 115 included in the first fin pattern F1 may contain the same material or different materials.

The first fin pattern F1 may include an element semiconductor material such as silicon or germanium. In addition, the first fin pattern F1 may include a compound semiconductor, such as a group IV-IV compound semiconductor or a group III-V compound semiconductor.

Specifically, the group IV-IV compound semiconductor that forms the first fin pattern F1 may be a binary or ternary compound containing two or more of carbon (C), silicon (Si), germanium (Ge) and tin (Sn) or a compound obtained by doping the binary or ternary compound with a group IV element.

The group III-V compound semiconductor that forms the first fin pattern F1 may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

The first heat-conducting layer 110 and the first upper pattern 115 included in the first fin pattern F1 may contain the same material.

In an example, the first fin pattern F1 may contain silicon. That is, the first fin pattern F1 may be a silicon fin pattern. Although the first heat-conducting layer 110 and the first upper pattern 115 contain silicon, they may have different thermal conductivities.

The first heat-conducting layer 110 may have higher thermal conductivity than the first upper pattern 115. The first heat-conducting layer 110 and the first upper pattern 115 which contain the same material can be made to have different thermal conductivities by controlling dopant concentrations of the first heat-conducting layer 110 and the first upper pattern 115, which is described hereinafter.

In another example, the first fin pattern F1 may contain silicon germanium. That is, the first fin pattern F1 may be a silicon fin pattern. Here, the silicon germanium contained in the first heat-conducting layer 110 and the first upper pattern 115 may have a substantially equal ratio of germanium to silicon.

The first heat-conducting layer 110 and the first upper pattern 115 included in the first fin pattern F1 may also contain different materials.

For example, the first upper pattern 115 may contain silicon, and the first heat-conducting layer 110 may contain silicon carbide. Even when the first heat-conducting layer 110 and the first upper pattern 115 contain different materials, the first heat-conducting layer 110 may have a thermal conductivity greater than the first upper pattern 115.

The first heat-conducting layer 110 and the first upper pattern 115 may contain different materials other than those described above. Even in this case, the first heat-conducting layer 110 may have a thermal conductivity greater than the first upper pattern 115.

In the following description, it will be assumed that the first upper pattern 115 and the first heat-conducting layer 110 contain the same material, more specifically, silicon.

The first gate electrode 120 may extend along a second direction Y1 to intersect the first fin pattern F1. The first gate electrode 120 may be formed on the first fin pattern F1 and the field insulating layer 105.

The first gate electrode 120 may be formed on the first part 115a of the first upper pattern 115. The first gate electrode 120 may cover the first fin pattern F1, which protrudes farther upward than the top surface of the field insulating layer 105.

The first gate electrode 120 may include at least one of, for example, polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al) and tungsten (W).

The first gate electrode 120 may be formed by, but not limited to, a replacement process (or a gate last process).

A first gate insulating layer 122 may be formed between the first fin pattern F1 and the first gate electrode 120. The first gate insulating layer 122 may be formed along the profile of the first fin pattern F1, which protrudes farther upward than the field insulating layer 105. In addition, the first gate insulating layer 122 may be formed between the first gate electrode 120 and the field insulating layer 105.

The first gate insulating layer 122 may include a high-k material having a higher dielectric constant than silicon oxide, silicon oxynitride, silicon nitride, and silicon oxide. For example, the high-k material may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

First gate spacers 125 may be formed on sidewalls of the first gate electrode 120 extending along the second direction Y1. The first gate spacers 125 may include at least one of silicon nitride (SiN), silicon oxynitride (SiON), silicon oxide ($SiO_2$), silicon oxycarbonitride (SiOCN), and combinations of the same.

The first source/drain regions 130 may be formed on both sides of the first gate electrode 120. The first source/drain regions 130 may be formed on the first fin pattern F1. For example, the first source/drain regions 130 may be formed on the second parts 115b of the first upper pattern 115, respectively.

In the semiconductor device 1 according to the first embodiment of the present inventive concept, each of the first source/drain regions 130 may include a first epitaxial layer 135 which fills the first recess 135r formed in the first fin pattern F1, that is, in one of the second parts 115b of the first upper pattern 115. That is, each of the first source/drain regions 130 may include the first epitaxial layer 135, which is formed on the top surface of one of the second parts 115b of the first upper pattern 115.

An outer circumferential surface of the first epitaxial layer 135 may have various shapes. For example, the outer circumferential surface of the first epitaxial layer 135 may have at least one of a diamond shape, a circular shape, and a rectangular shape. In FIG. 4, a diamond shape (or a pentagonal shape or a hexagonal shape) is illustrated as an example.

If the semiconductor device 1 according to the first embodiment of the present inventive concept is a p-channel metal oxide semiconductor (PMOS) transistor, the first epitaxial layer 135 may include a compressive stress material. The compressive stress material may be a material (e.g., SiGe) having a greater lattice constant than Si. The compressive stress material may improve the mobility of carriers in the channel region by applying compressive stress to the first fin pattern F1.

On the other hand, if the semiconductor device 1 according to the first embodiment of the present inventive concept is an n-channel metal oxide semiconductor (NMOS) transistor, the first epitaxial layer 135 may include the same material as the first fin pattern F1 or a tensile stress material. For example, if the first fin pattern F1 is made of Si, the first epitaxial layer 135 may be made of Si or a material (e.g., SiC) having a smaller lattice constant than Si.

Although not illustrated in FIGS. 2 and 4, in semiconductor devices according to embodiments of the present inventive concept, each of the first source/drain regions 130 may further include a metal silicide layer formed on the first epitaxial layer 135.

Referring to FIGS. 3 and 5, a dopant concentration of the first upper pattern 115 may be greater than a dopant concentration of the first heat-conducting layer 110 and a dopant concentration of the substrate 100.

In addition, the dopant concentration of the first heat-conducting layer 110 may be different from the dopant concentration of the substrate 100.

The substrate 100 may contain various types of dopants. In the description of the semiconductor devices according to the embodiments of the present inventive concept, "dopant concentration" will be described as the concentration of an n-type dopant and/or a p-type dopant in each layer.

In the semiconductor device 1 according to the first embodiment of the present inventive concept, the dopant concentration of the first heat-conducting layer 110 may be constant along a thickness direction of the first heat-conducting layer 110, e.g., a thickness direction of the substrate 100. The thickness may correspond to a height of the first heat-conducting layer 110 on the substrate 100.

In addition, in the semiconductor device 1 according to the first embodiment of the present inventive concept, the dopant concentration of the first heat-conducting layer 110 may be greater than the dopant concentration of the substrate 100. That is, referring to FIG. 5, the dopant concentration may increase in the order of the substrate 100, the first heat-conducting layer 110, and the first upper pattern 115.

In FIG. 5, the dopant concentration increases discontinuously between the substrate 100 and the first heat-conducting layer 110 and between the first heat-conducting layer 110 and the first upper pattern 115. However, this is merely an example used for ease of description, and the present disclosure is not limited to this example.

That is, dopant diffusion may occur between, for example, the substrate 100 and the first heat-conducting layer 110, causing a slope or fluctuation in dopant concentration between the substrate 100 and the first heat-conducting layer 110.

In an example, the first upper pattern 115 and the first heat-conducting layer 110 may have the same conductivity type. If the semiconductor devices according to the embodiments of the present inventive concept are PMOS transistors, the first heat-conducting layer 110 and the first upper pattern 115 used as the channel region may be n-type semiconductor layers. On the other hand, if the semiconductor devices according to the embodiments of the present inventive concept are NMOS transistors, the first heat-conducting layer 110 and the first upper pattern 115 used as the channel region may be p-type semiconductor layers.

In another example, the first upper pattern 115 and the first heat-conducting layer 110 may have different conductivity types. If the semiconductor devices according to the embodiments of the present inventive concept are PMOS transistors, the first upper pattern 115 used as the channel region may be an n-type semiconductor layer, and the first heat-conducting layer 110 may be a p-type semiconductor layer. On the other hand, if the semiconductor devices according to the embodiments of the present inventive concept are NMOS transistors, the first upper pattern 115 used as the channel region may be ap-type semiconductor layer, and the first heat-conducting layer 110 may be an n-type semiconductor layer.

Further, an n-type semiconductor layer may include only an n-type dopant or both an n-type dopant and a p-type dopant. That is, if the concentration of the n-type impurity in a semiconductor layer is greater than that of the p-type dopant in the semiconductor layer, the semiconductor layer may be an n-type semiconductor layer.

Therefore, if both the first upper pattern 115 and the first heat-conducting layer 110 are p-type semiconductor layers, each of the first upper pattern 115 and the first heat-conducting layer 110 may include only the p-type dopant or both the p-type dopant and the n-type dopant. On the other hand, if both the first upper pattern 115 and the first heat-conducting layer 110 are n-type semiconductor layers, each of the first upper pattern 115 and the first heat-conducting layer 110 may include only the n-type dopant or both the n-type dopant and the p-type dopant.

The thermal conductivity of a semiconductor layer according to dopant concentration may be as follows.

Heat generated in a semiconductor layer may be affected by phonons that are lattice vibrations of a material that forms the semiconductor layer. That is, a factor that affects the lattice vibrations of the material of the semiconductor layer can change the thermal conductivity of the semiconductor layer.

If a dopant is doped or injected into the semiconductor layer to make the semiconductor layer have a particular conductivity type, the thermal conductivity of the semiconductor layer may vary according to the concentration of the dopant.

For example, the dopant contained in the semiconductor layer may act as a factor that hinders lattice vibrations of a semiconductor material. That is, the dopant contained in the semiconductor layer may cause phonon scattering.

Therefore, as the concentration of the dopant in the semiconductor layer increases, phonon scattering may occur more significantly. Accordingly, an increase in the concentration of the dopant in the semiconductor layer may reduce the thermal conductivity of the semiconductor layer.

A path through which heat generated in a channel region of a fin field effect transistor (FinFET) can be dissipated is narrower than a path through which heat generated in a channel region of a planar transistor can be dissipated. That is, in the case of the FinFET, the path through which heat generated in the channel region can be dissipated is limited by a width of a fin pattern. Therefore, the FinFET may be vulnerable to heat generated in the channel region (that is, self-heating).

However, in the semiconductor devices according to the embodiments of the present inventive concept, the first heat-conducting layer 110 having high thermal conductivity is interposed between the substrate 100 and the first upper pattern 115 used as the channel region of a transistor. Therefore, heat generated in the first upper pattern 115 can be efficiently dissipated to the substrate 100.

In other words, in semiconductor devices according to embodiments of the present inventive concept, the first heat-conducting layer 110 has a lower dopant concentration than the first upper pattern 115 is disposed under the first upper pattern 115. Therefore, heat generated in the first upper pattern 115 can be efficiently dissipated to the substrate 100. Accordingly, the operating performance and reliability of the semiconductor devices can be improved.

Figure 6:
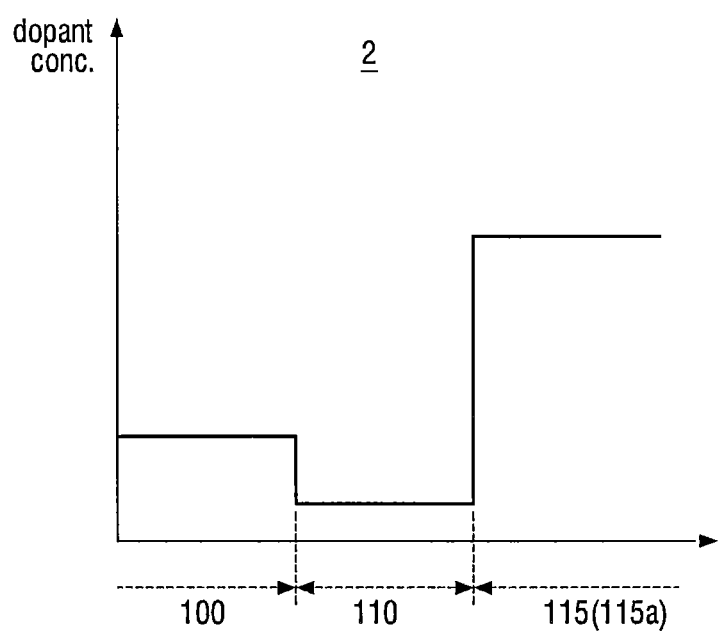
FIG. 6 is a schematic diagram illustrating dopant concentrations of a substrate and a fin pattern included in a semiconductor device according to a second embodiment of the present inventive concept.
Figure 7:
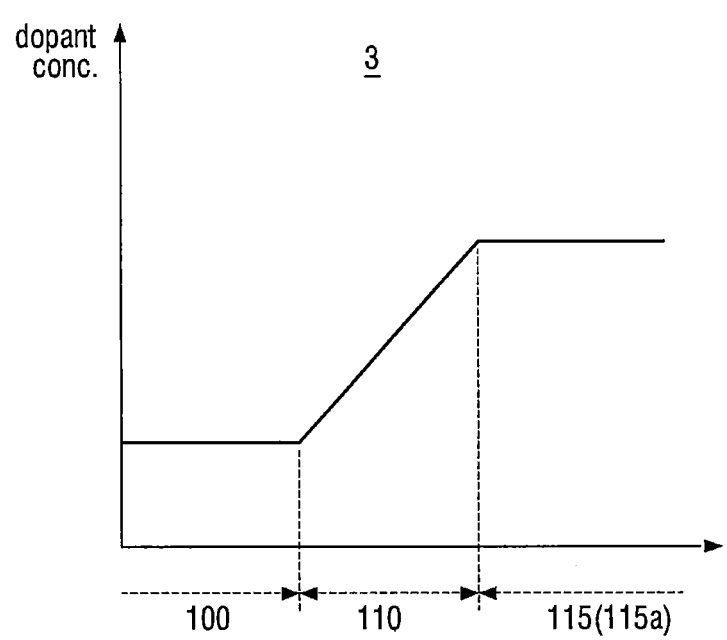
FIG. 7 is a schematic diagram illustrating dopant concentrations of a substrate and a fin pattern included in a semiconductor device according to a third embodiment of the present inventive concept.
Figure 8:
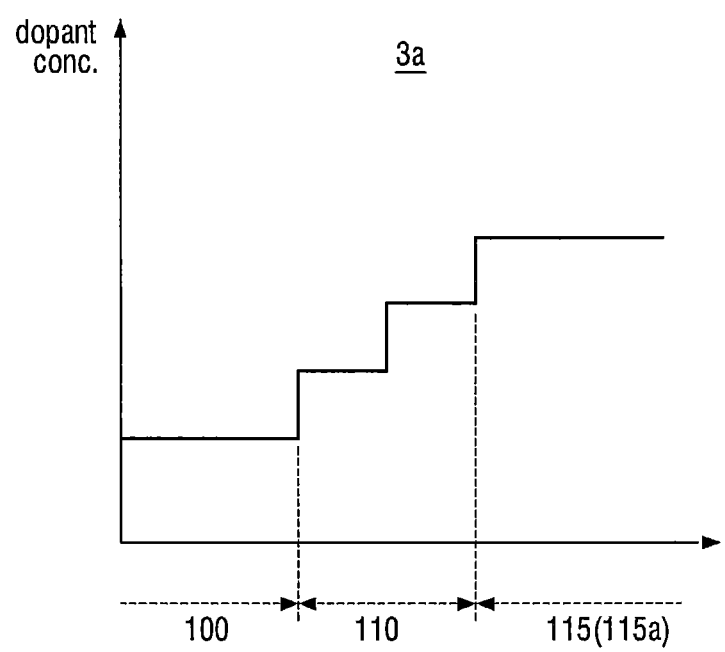
FIG. 8 is a schematic diagram illustrating dopant concentrations of a substrate and a fin pattern included in a semiconductor device according to a modified example of the third embodiment of the present inventive concept.
Figure 9:
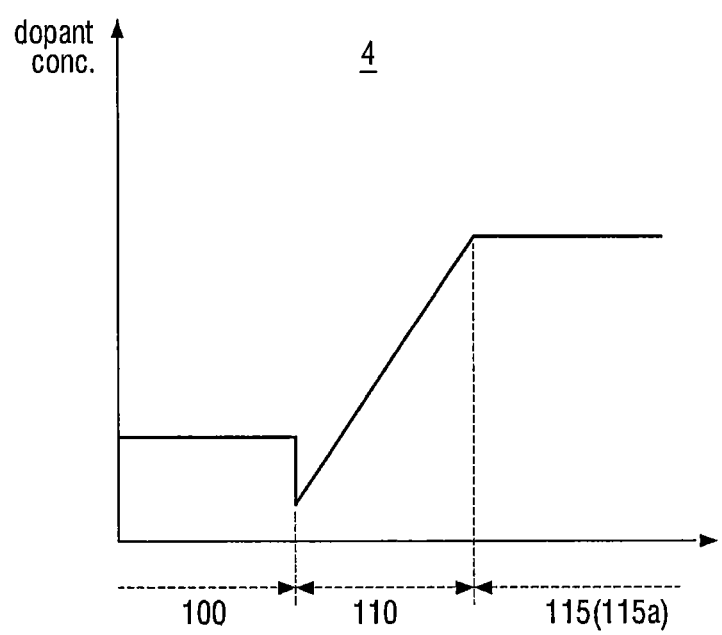
FIG. 9 is a schematic diagram illustrating dopant concentrations of a substrate and a fin pattern included in a semiconductor device according to a fourth embodiment of the present inventive concept.
Figure 10:
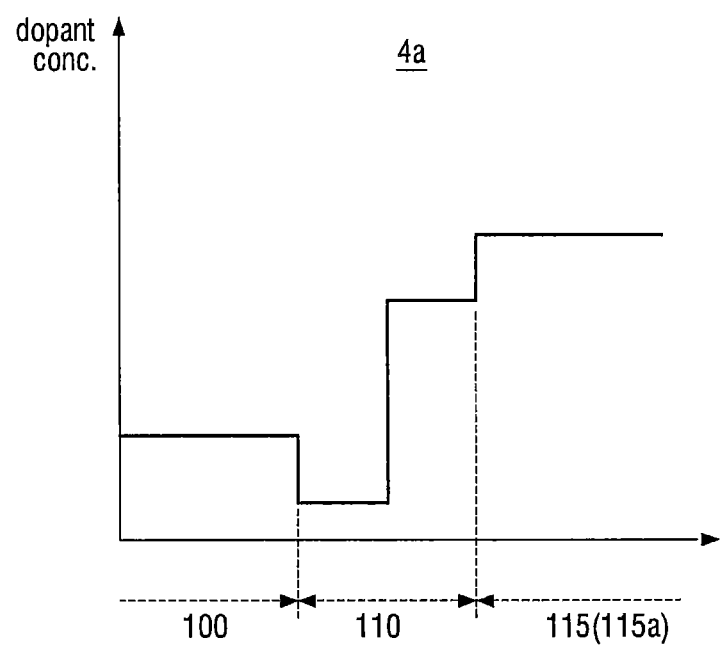
FIG. 10 is a schematic diagram illustrating dopant concentrations of a substrate and a fin pattern included in a semiconductor device according to a modified example of the fourth embodiment of the present inventive concept.

FIG. 6 is a schematic diagram illustrating dopant concentrations of a substrate and a fin pattern included in a semiconductor device 2 according to a second embodiment of the present inventive concept. FIG. 7 is a schematic diagram illustrating dopant concentrations of a substrate and a fin pattern included in a semiconductor device 3 according to a third embodiment of the present inventive concept. FIG. 8 is a schematic diagram illustrating dopant concentrations of a substrate and a fin pattern included in a semiconductor device 3a according to a modified example of the third embodiment of the present inventive concept. FIG. 9 is a schematic diagram illustrating dopant concentrations of a substrate and a fin pattern included in a semiconductor device 4 according to a fourth embodiment of the present inventive concept. FIG. 10 is a schematic diagram illustrating dopant concentrations of a substrate and a fin pattern included in a semiconductor device 4a according to a modified example of the fourth embodiment of the present inventive concept. For simplicity, the following description will focus on differences with FIGS. 1 through 5.

For reference, each of FIGS. 6 through 10 is a schematic diagram illustrating dopant concentration along Line 1 of FIG. 3.

Referring to FIG. 6, in the semiconductor device 2 according to the second embodiment of the present inventive concept, a dopant concentration of a first heat-conducting layer 110 may be constant in a thickness direction of the first heat-conducting layer 110, that is, a thickness direction of a substrate 100. The dopant concentration of the first heat-conducting layer 110 may be less than a dopant concentration of the substrate 100.

In addition, a dopant concentration of the first upper pattern 115 may be greater than the dopant concentration of the first heat-conducting layer 110.

Therefore, the dopant concentration of the first heat-conducting layer 110 may be less than the dopant concentration of the first upper pattern 115 and the dopant concentration of the substrate 100.

Further, the first heat-conducting layer 110 may be, but is not limited to, an undoped pattern.

Here, when the first heat-conducting layer 110 is "undoped," it means that the first heat-conducting layer 110 does not contain a dopant intentionally doped or injected by a manufacturer of the semiconductor device 2 but does not mean that the first heat-conducting layer 110 contains no dopant.

That is, the first heat-conducting layer 110 may contain a dopant moved from the substrate 100 or the first upper pattern 115 by, for example, diffusion.

Referring to FIG. 7, in the semiconductor device 3 according to the third embodiment of the present inventive concept, a dopant concentration of a first heat-conducting layer 110 may vary along a thickness direction of the first heat-conducting layer 110, that is, a thickness direction of a substrate 100.

For example, the dopant concentration of the first heat-conducting layer 110 may increase as the distance from the substrate 100 increases. The dopant concentration of the first heat-conducting layer 110 may continuously increase from a lowest part of the first heat-conducting layer 110 toward a highest part of the first heat-conducting layer 110.

In FIG. 7, the dopant concentration profile of the first heat-conducting layer 110 varies linearly. However, this is merely an example used for ease of description, and the present disclosure is not limited to this example.

While the dopant concentration of the first heat-conducting layer 110 varies along the thickness direction of the substrate 100, it may be less than or equal to a dopant concentration of a first upper pattern 115 and greater than or equal to a dopant concentration of the substrate 100.

That is, in the semiconductor device 3 according to the third embodiment of the present inventive concept, the dopant concentration of the first heat-conducting layer 110 may not be less than the dopant concentration of the substrate 100 and may not be greater than the dopant concentration of the first upper pattern 115.

The dopant concentration of the first heat-conducting layer 110 around the center of the first heat-conducting layer 110 may be greater than the dopant concentration of the substrate 100 and less than the dopant concentration of the first upper pattern 115.

In FIG. 7, the dopant concentration is continuous between the substrate 100 and the first heat-conducting layer 110 and between the first heat-conducting layer 110 and the first upper pattern 115. However, this is merely an example used for ease of description, and the present disclosure is not limited to this example.

That is, the dopant concentration of the first heat-conducting layer 110 at a lowest part of the first heat-conducting layer 110 may be greater than the dopant concentration of the substrate 100, and the dopant concentration of the first heat-conducting layer 110 at a highest part of the first heat-conducting layer 110 may be less than the dopant concentration of the first upper pattern 115.

Because the dopant concentration of the first heat-conducting layer 110 increases as the distance from the substrate 100 increases, a punch-through phenomenon in the semiconductor device 3 can be reduced, and heat generated in a channel region of the semiconductor device 3 can be efficiently dissipated to the substrate 100.

Referring to FIG. 8, in the semiconductor device 3a according to the modified example of the third embodiment of the present inventive concept, a dopant concentration of a first heat-conducting layer 110 may increase in a staircase manner as the distance from a substrate 100 increases.

In other words, the first heat-conducting layer 110 may include a plurality of heat-conducting layers having different dopant concentrations. Accordingly, an upper heat-conducting layer closer to a first upper pattern 115 may have a higher dopant concentration than a lower heat-conducting layer farther from the first upper pattern 115.

Referring to FIG. 9, in the semiconductor device 4 according to the fourth embodiment of the present inventive concept, a dopant concentration of a first heat-conducting layer 110 may vary along a thickness direction of the first heat-conducting layer 110, that is, a thickness direction of a substrate 100. The first heat-conducting layer 110 may include a part having a lower dopant concentration than the substrate 100.

For example, the first heat-conducting layer 110 may include an undoped semiconductor region in a part adjacent to the substrate 100, but the present disclosure is not limited thereto.

The dopant concentration of the first heat-conducting layer 110 may increase as the distance from the substrate 100 increases. The dopant concentration of the first heat-conducting layer 110 may increase continuously from a lowest part of the first heat-conducting layer 110 toward a highest part of the first heat-conducting layer 110.

At the lowest part of the first heat-conducting layer 110, the dopant concentration of the first heat-conducting layer 110 may be less than that of the substrate 100. In addition, while the dopant concentration of the first heat-conducting layer 110 varies along the thickness direction of the substrate 100, it may be less than or equal to a dopant concentration of the first upper pattern 115.

In FIG. 9, the dopant concentration of the first heat conducting layer 110 around the center of the first heat-conducting layer 110 is greater than the dopant concentration of the substrate 100, but the present disclosure is not limited thereto.

Further, in FIG. 9, the dopant concentration profile of the first heat-conducting layer 110 varies linearly. In addition, the dopant concentration is discontinuous between the substrate 100 and the first heat-conducting layer 110. However, this is merely an example used for ease of description, but the present disclosure is not limited to this example.

Referring to FIG. 10, in the semiconductor device 4a according to the modified example of the fourth embodiment of the present inventive concept, a dopant concentration of a first heat-conducting layer 110 may increase in a staircase manner as the distance from a substrate 100 increases.

The first heat-conducting layer 110 may include a plurality of heat-conducting layers having different dopant concentrations. For example, in the first heat-conducting layer 110, a heat-conducting layer having a lower dopant concentration than the substrate 100 may be disposed in a region closest to the substrate 100, and a heat-conducting layer having a greater dopant concentration than the substrate 100 may be disposed in a region close to a first upper pattern 115.

In the first heat-conducting layer 110, the heat-conducting layer having a lower dopant concentration than the substrate 100 may include an undoped semiconductor epitaxial layer, but the present disclosure is not limited thereto.

Figure 11:
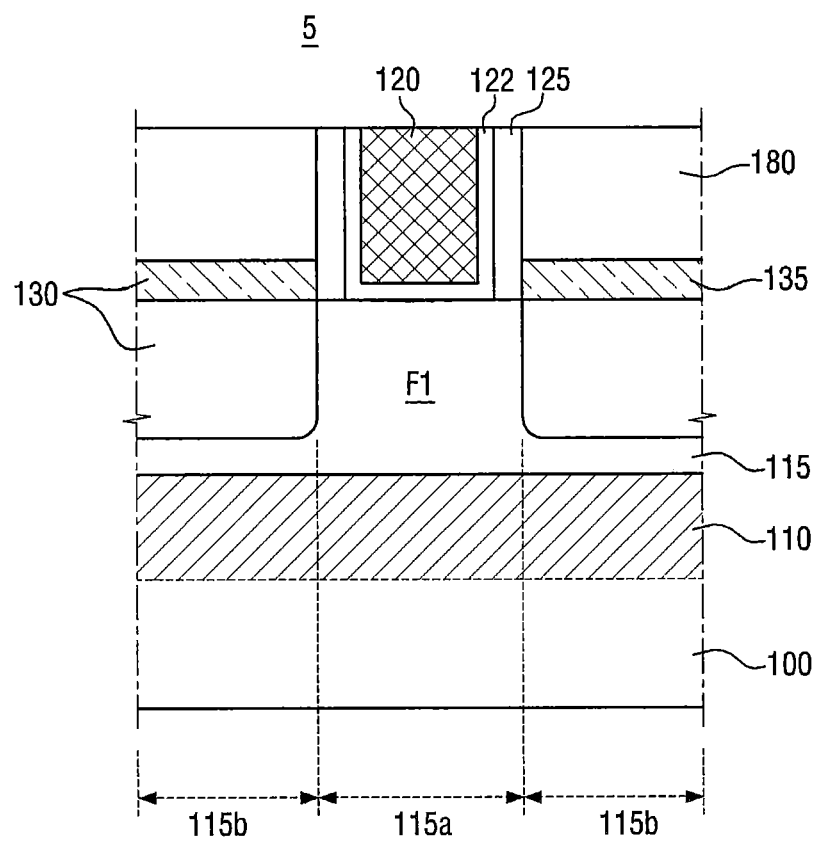
FIGS. 11 and 12 are views of a semiconductor device according to a fifth embodiment of the present inventive concept.
Figure 12:
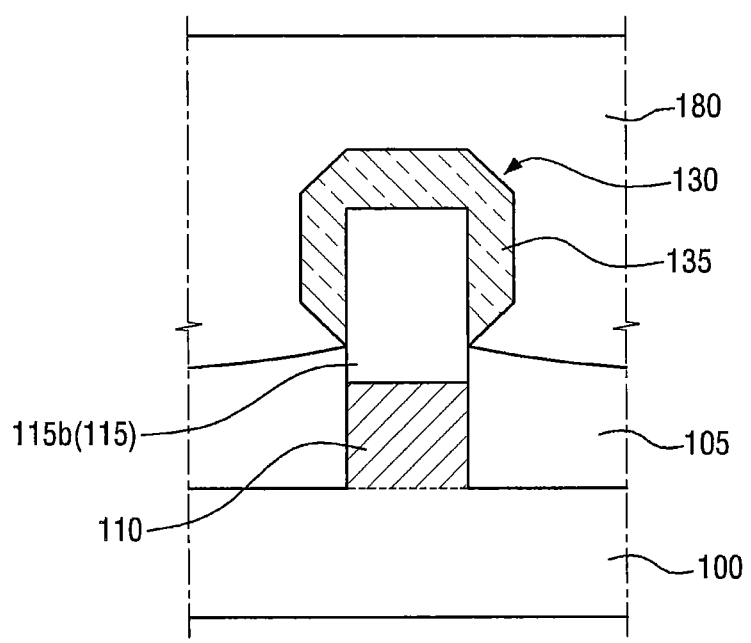

FIGS. 11 and 12 are views of a semiconductor device 5 according to a fifth embodiment of the present inventive concept. For simplicity, the following description will focus on differences with FIGS. 1 through 5.

For reference, FIG. 11 is a cross-sectional view taken along the line A-A of FIG. 1, and FIG. 12 is a cross-sectional view taken along the line C-C of FIG. 1.

Referring to FIGS. 11 and 12, in the semiconductor device 5 according to the fifth embodiment of the present inventive concept, each of first source/drain regions 130 may include a first epitaxial layer 135 formed along the profile of a first fin pattern F1.

The first epitaxial layer 135 may be formed on sidewalls and a top surface of the first fin pattern F1, which protrudes farther upward than a top surface of a field insulating layer 105.

If a first upper pattern 115 contains silicon, the first epitaxial layer 135 may contain, but is not limited to, silicon, silicon germanium, germanium, silicon carbide, etc.

In FIG. 11, top surfaces of second parts 115b of the first upper pattern 115 lie in the same plane with a top surface of a first part 115a of the first upper pattern 115, but the present disclosure is not limited thereto.

The second parts 115b of the first upper pattern 115 may be more recessed than the first part 115a of the first upper pattern 115. Part of the first fin pattern F1 in which the first source/drain regions 130 are formed may protrude farther upward than the top surface of the field insulating layer 105, and the first epitaxial layer 135 may be formed along the profile of the first fin pattern F1, which protrudes farther upward than the top surface of the field insulating layer 105.

Figure 13:
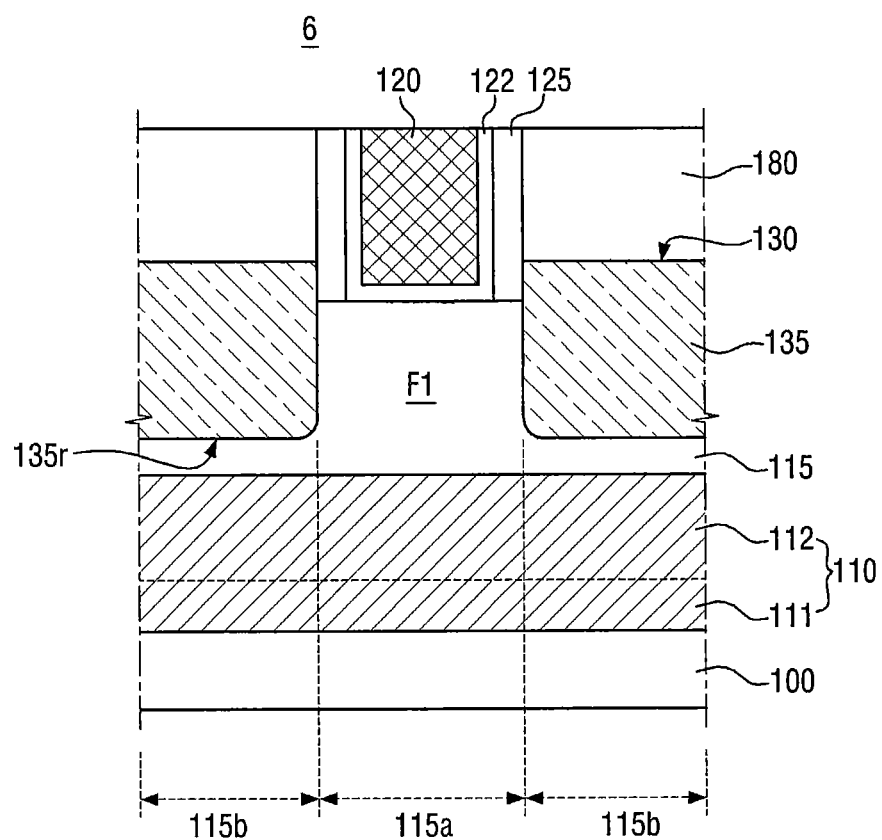
FIGS. 13 through 15 are views of a semiconductor device according to a sixth embodiment of the present inventive concept.
Figure 14:
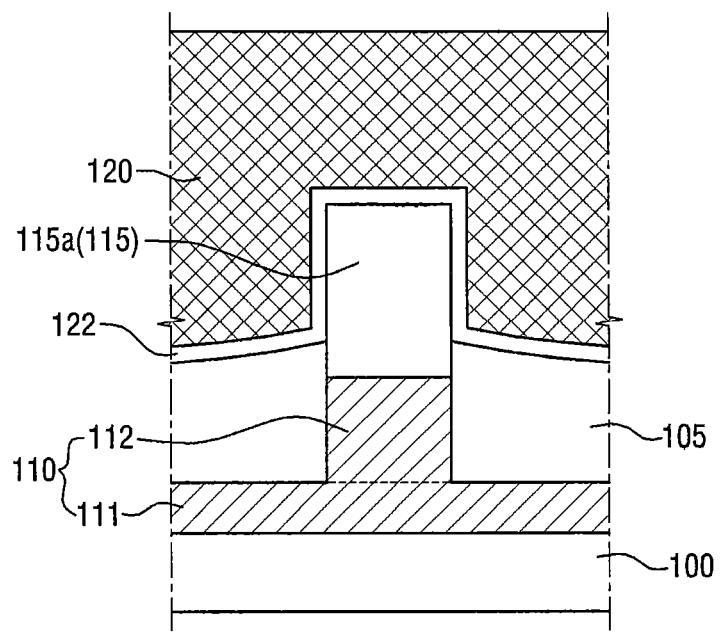
Figure 15:
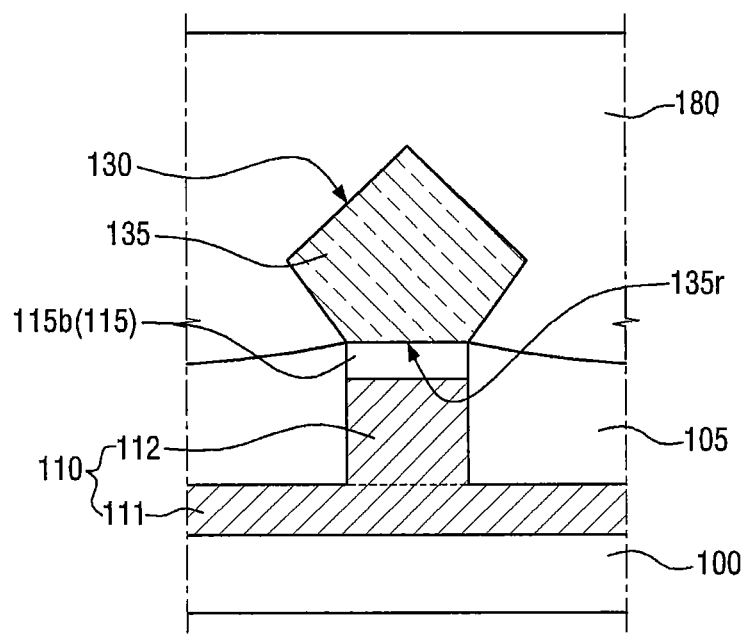

FIGS. 13 through 15 are views of a semiconductor device 6 according to a sixth embodiment of the present inventive concept. For simplicity, the following description will focus on differences with FIGS. 1 through 5.

For reference, FIG. 13 is a cross-sectional view taken along the line A-A of FIG. 1, FIG. 14 is a cross-sectional view taken along the line B-B of FIG. 1, and FIG. 15 is a cross-sectional view taken along the line C-C of FIG. 1.

Referring to FIGS. 13 through 15, in the semiconductor device 6 according to the sixth embodiment of the present inventive concept, a first heat-conducting layer 110 may include a first base layer 111 and a first protruding pattern 112.

The first base layer 111 may include a first surface and a second surface, which face each other. The first surface of the first base layer 111 may face the substrate 100. The first protruding pattern 112 may protrude from the first base layer 111, more specifically, from the second surface of the first base layer 111. The first protruding pattern 112 may protrude from the first base layer 111 in a direction away from the substrate 100.

The first base layer 111 may be directly connected to the first protruding pattern 112. The first protruding pattern 112 may be located directly on the first base layer 111. That is, the first base layer 111 and the first protruding pattern 112 may be an integral structure.

In FIGS. 1 and 14, because the first protruding pattern 112 protrudes from part of the first base layer 111, a width of the first base layer 111 in a second direction Y1 is greater than that of the first protruding pattern 112 in the second direction Y1.

In the semiconductor device 6 according to the sixth embodiment of the present inventive concept, a first fin pattern F1 may include only part of the first heat-conducting layer 110. Specifically, the first protruding pattern 112 may be included in the first fin pattern F1, but the first base layer 111 may not be included in the first fin pattern F1.

In other words, the first base layer 111 may be an insertion layer interposed between the first fin pattern F1 and the substrate 100. The first fin pattern F1 may protrude from the first base layer 111.

A field insulating layer 105, which defines the first fin pattern F1, may be formed on the first base layer 111. Therefore, sidewalls of the first protruding pattern 112 included in the first fin pattern F1 may be entirely covered by the field insulating layer 105. A first upper pattern 115 may be disposed on the first protruding pattern 112.

In FIG. 14, the dopant concentration profile of the substrate 100, the first heat-conducting layer 110 and the first upper pattern 115 may be any one of FIGS. 5 through 10. In addition, because the descriptions of FIGS. 5 through 10 can be quoted, the dopant concentration profile of the substrate 100, the first heat-conducting layer 110 and the first upper pattern 115 will be described briefly.

In FIGS. 5 and 6, a dopant concentration of the first heat-conducting layer 110 may be constant along a thickness direction of the first heat-conducting layer 110. The dopant concentration of the first heat-conducting layer 110 may be less than a dopant concentration of the first upper pattern 115. The dopant concentration of the first heat-conducting layer 110 may be different from a dopant concentration of the substrate 100.

Accordingly, a dopant concentration of the first base layer 111 may be substantially equal to a dopant concentration of the first protruding pattern 112.

In addition, the dopant concentration of the first base layer 111 and the dopant concentration of the first protruding pattern 112 may be different from the dopant concentration of the substrate 100 and may be less than the dopant concentration of the first upper pattern 115.

If the first heat-conducting layer 110 is an undoped epitaxial layer, the first base layer 111 may include an undoped semiconductor region.

In FIGS. 7 through 10, the dopant concentration of the first heat-conducting layer 110 may vary along the thickness direction of the first heat-conducting layer 110, that is, the thickness direction of the substrate 100. For example, the dopant concentration of the first heat-conducting layer 110 may increase as the distance from the substrate 100 increases.

Accordingly, the dopant concentration of the first base layer 111 and the dopant concentration of the first protruding pattern 112 may increase as the distance from the substrate 100 increases.

Because the dopant concentration of the first heat-conducting layer 110 varies along the thickness direction of the first heat-conducting layer 110, the dopant concentration of the first base layer 111 may be different from the dopant concentration of the first protruding pattern 112. However, the first base layer 111 and the first protruding pattern 112 may contain the same dopant.

Because the first base layer 111 is separated further from the first upper pattern 115 than the first protruding pattern 112, the dopant concentration of the first base layer 111 is less than the dopant concentration of the first upper pattern 115.

Further, if the first heat-conducting layer 110 includes a part having a dopant concentration less than the substrate 100, the first base layer 111 may include a part having a dopant concentration less than the substrate 100 because the first base layer 111 is closer to the substrate 100 than the first protruding pattern 112.

If the first heat-conducting layer 110 includes an undoped region, the first base layer 111 may include an undoped semiconductor region.

Because the first heat-conducting layer 110 includes the first base layer 111 interposed between the first fin pattern F1 and the substrate 100, heat generated in the first upper pattern 115 used as a channel region can be efficiently dissipated to the substrate 100.

In other words, heat generated in the channel region reaches the first base layer 111 via the first protruding pattern 112. Here, the heat generated in the channel region meets the first base layer 111, which is wider than the first protruding pattern 112. Accordingly, an area through which the heat that passed through the first protruding pattern 112 can be dissipated increases. Because the amount of heat dissipated is affected by the area of a heat-conducting layer, which dissipates heat, heat generated in the first upper pattern 115 used as the channel region can be dissipated to the substrate 100 more efficiently.

Figure 16:
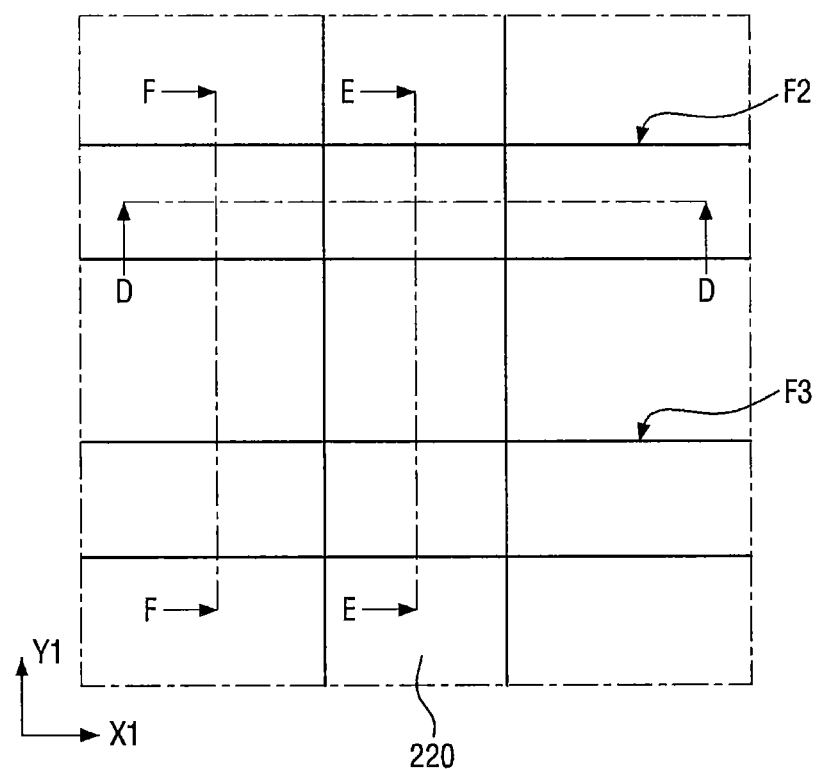
FIG. 16 is a layout view of a semiconductor device according to a seventh embodiment of the present inventive concept.
Figure 17:
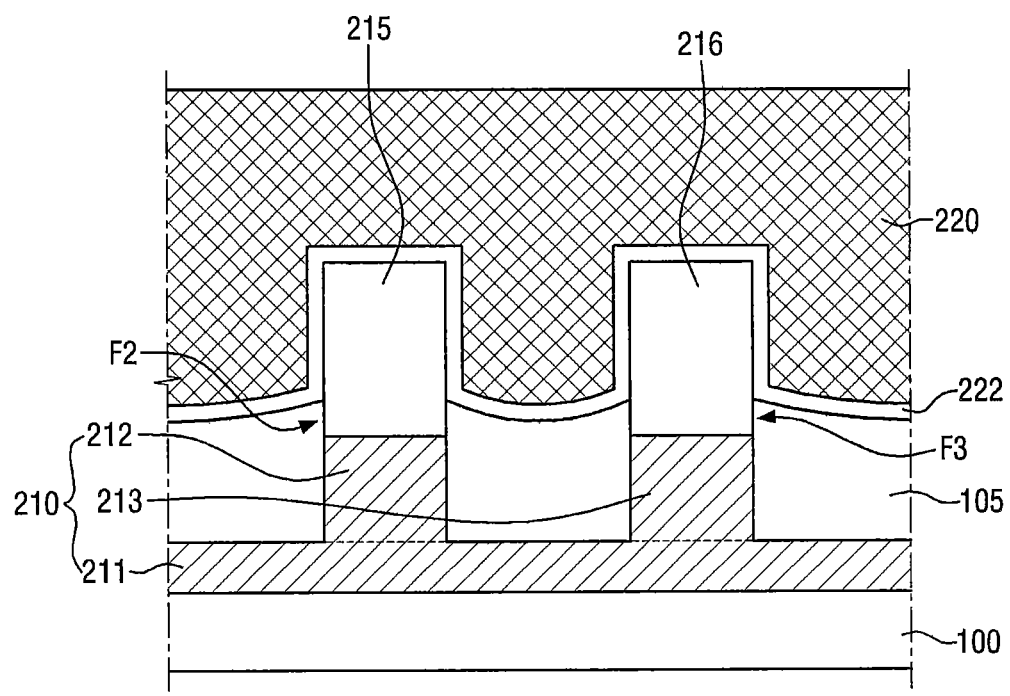
FIG. 17 is a cross-sectional view taken along the line E-E of FIG. 16.
Figure 18:
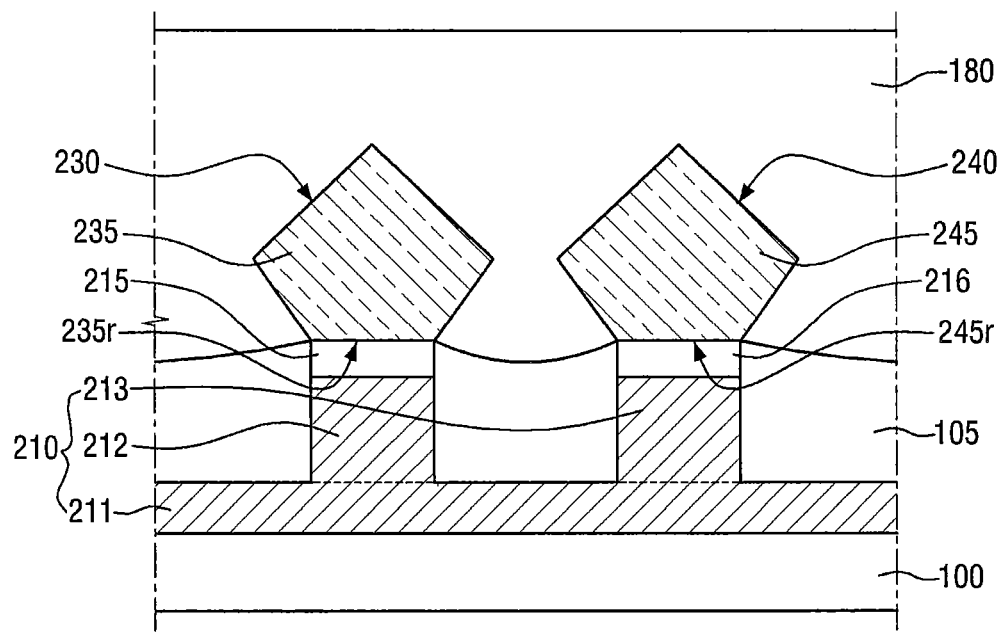
FIG. 18 is a cross-sectional view taken along the line F-F of FIG. 16.

FIG. 16 is a layout view of a semiconductor device 7 according to a seventh embodiment of the present inventive concept. FIG. 17 is a cross-sectional view taken along the line E-E of FIG. 16. FIG. 18 is a cross-sectional view taken along the line F-F of FIG. 16.

For reference, a cross-sectional view taken along the line D-D of FIG. 16 may be substantially similar to FIG. 2 except for reference characters.

Referring to FIGS. 16 through 18, the semiconductor device 7 according to the seventh embodiment of the present inventive concept may include a second heat-conducting layer 210, a second upper pattern 215, a third upper pattern 216, and a second gate electrode 220.

The second heat-conducting layer 210 may be formed on a substrate 100. The second heat-conducting layer 210 may include a second base layer 211, a second protruding pattern 212, and a third protruding pattern 213.

The second protruding pattern 212 and the third protruding pattern 213 may protrude from the second base layer 211. Each of the second protruding pattern 212 and the third protruding pattern 213 may protrude from the second base layer 211 in a direction away from the substrate 100.

The second base layer 211 may be directly connected to the second protruding pattern 212 and the third protruding pattern 213. Each of the second protruding pattern 212 and the third protruding pattern 213 may be located directly on the second base layer 211. Each of the second protruding pattern 212 and the third protruding pattern 213 may extend along a first direction X1.

The second upper pattern 215 may be formed on the second heat-conducting layer 210, that is, the second protruding pattern 212, and the third upper pattern 216 may be formed on the third protruding pattern 213. Each of the second upper pattern 215 and the third upper pattern 216 may extend along the first direction X1.

For example, the second upper pattern 215 may be directly connected to the second protruding pattern 212, and the third upper pattern 216 may be directly connected to the third protruding pattern 213, but the present disclosure is not limited thereto.

In the semiconductor device 7 according to the seventh embodiment of the present inventive concept, a second fin pattern F2 may include the second upper pattern 215 and the second protruding pattern 212, and a third fin pattern F3 may include the third upper pattern 216 and the third protruding pattern 213. The second base layer 211 may not be included in the second fin pattern F2 and the third fin pattern F3.

A field insulating layer 105 may define the second fin pattern F2 and the third fin pattern F3. The field insulating layer 105 may be formed on the second base layer 211. Therefore, the field insulating layer 105 may entirely cover sidewalls of the second protruding pattern 212 and sidewalls of the third protruding pattern 213.

Because at least part of the second fin pattern F2 and a least part of the third fin pattern F3 protrude farther upward than a top surface of the field insulating layer 105, at least part of the second protruding pattern 212 and at least part of the third protruding pattern 213 may protrude further upward than the top surface of the field insulating layer 105.

The second gate electrode 220 may extend along a second direction Y1 to intersect the second fin pattern F2 and the third fin pattern F3. The second gate electrode 220 may be formed on the second fin pattern F2, the third fin pattern F3, and the field insulating layer 105.

The second gate electrode 220 may cover the second fin pattern F2 and the third fin pattern F3, which protrude farther upward than the top surface of the field insulating layer 105.

A second gate insulating layer 222 may be formed between the second fin pattern F2 and the second gate electrode 220 and between the third fin pattern F3 and the second gate electrode 220. The second gate insulating layer 222 may be formed along the profile of the second fin pattern F2 and the third fin pattern F3 which protrude farther upward than the field insulating layer 105. In addition, the second gate insulating layer 222 may be disposed between the second gate electrode 220 and the field insulating layer 105.

Second source/drain regions 230 may be formed on the second fin pattern F2 on both sides of the second gate electrode 220. Third source/drain regions 240 may be formed on the third fin pattern F3 on both sides of the second gate electrode 220.

In FIG. 18, each of the second source/drain regions 230 may include a second epitaxial layer 235, which fills a second recess 235r formed in the second fin pattern F2, and each of the third source/drain regions 240 may include a third epitaxial layer 245 which fills a third recess 245r formed in the third fin pattern F3. However, the present disclosure is not limited thereto.

That is, the second epitaxial layer 235 and the third epitaxial layer 245 may be shaped like the first epitaxial layer 135 illustrated in FIG. 12.

The second fin pattern F2 and the third fin pattern F3 are similar to the first fin pattern F1 described above, and the second gate electrode 220 and the second gate insulating layer 222 are similar to the first gate electrode 120 and the first gate insulating layer 122 described above. Therefore, a description of these elements will be omitted. In addition, the second source/drain regions 230 and the third source/drain regions 240 are similar to the first source/drain regions 130 described above, and thus a description thereof will be omitted.

In FIG. 17, the dopant concentration profile of the substrate 100, the second base layer 211, the second protruding pattern 212 and the second upper pattern 215 may be any one of FIGS. 5 through 10. In addition, because the descriptions of FIGS. 5 through 10 can be quoted, the dopant concentration profile of the substrate 100, the second base layer 211, the second protruding pattern 212 and the second upper pattern 215 will be described briefly.

In addition, the dopant concentration profile of the third protruding pattern 213 and the third upper pattern 216 may be substantially the same as that of the second protruding pattern 212 and the second upper pattern 215.

In FIGS. 5 and 6, a dopant concentration of the second heat-conducting layer 210 may be constant along a thickness direction of the second heat-conducting layer 210. A dopant concentration of the substrate 100 and the dopant concentration of the second heat-conducting layer 210 may be less than a dopant concentration of the second upper pattern 215.

The dopant concentration of the second heat-conducting layer 210 may be different from the dopant concentration of the substrate 100. In addition, a dopant concentration of the second base layer 211 may be substantially equal to a dopant concentration of the second protruding pattern 212.

Accordingly, the dopant concentration of the second base layer 211 and the dopant concentration of the second protruding pattern 212 may be different from the dopant concentration of the substrate 100 and may be less than the dopant concentration of the second upper pattern 215.

If the second heat-conducting layer 210 is an undoped epitaxial layer, the second epitaxial layer 211 may include an undoped semiconductor region.

In FIGS. 7 through 10, the dopant concentration of the second heat-conducting layer 210 may vary along the thickness direction of the second heat-conducting layer 210, that is, the thickness direction of the substrate 100. For example, the dopant concentration of the second heat-conducting layer 210 may increase as the distance from the substrate 100 increases.

Accordingly, the dopant concentration of the second base layer 211 and the dopant concentration of the second protruding pattern 212 may increase as the distance from the substrate 100 increases.

Because the dopant concentration of the second heat-conducting layer 210 varies along the thickness direction of the second heat-conducting layer 210, the dopant concentration of the second base layer 211 may be different from the dopant concentration of the second protruding pattern 212. However, the second base layer 211 and the second protruding pattern 212 may contain the same dopant concentration.

Because the second base layer 211 is separated farther from the second upper pattern 215 than the second protruding pattern 212, the dopant concentration of the second base layer 211 is less than the dopant concentration of the second upper pattern 215.

Further, if the second heat-conducting layer 210 includes a part having a dopant concentration less than the substrate 100, the second base layer 211 may include a part having a dopant concentration less than the substrate 100 because the second base layer 211 is closer to the substrate 100 than the second protruding pattern 212.

If the second heat-conducting layer 210 includes an undoped region, the second base layer 211 may include an undoped semiconductor region.

Figure 19:
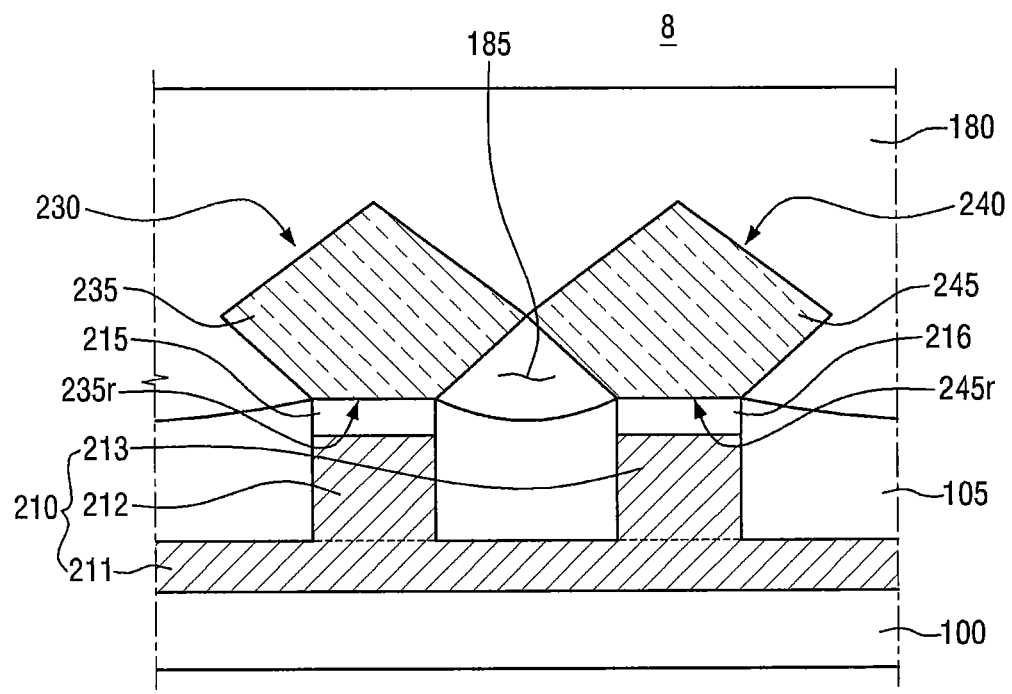
FIG. 19 is a view of a semiconductor device according to an eighth embodiment of the present inventive concept.

FIG. 19 is a view of a semiconductor device 8 according to an eighth embodiment of the present inventive concept. For simplicity, the following description will focus on differences with FIGS. 16 through 18.

For reference, FIG. 19 is a cross-sectional view taken along the line F-F of FIG. 16.

Referring to FIG. 19, in the semiconductor device 8 according to the eighth embodiment of the present inventive concept, a second epitaxial layer 235 and a third epitaxial layer 245 may contact each other.

An air gap 185 may be disposed between a second source/drain region 230 and a third source/drain region 240.

Figure 20:
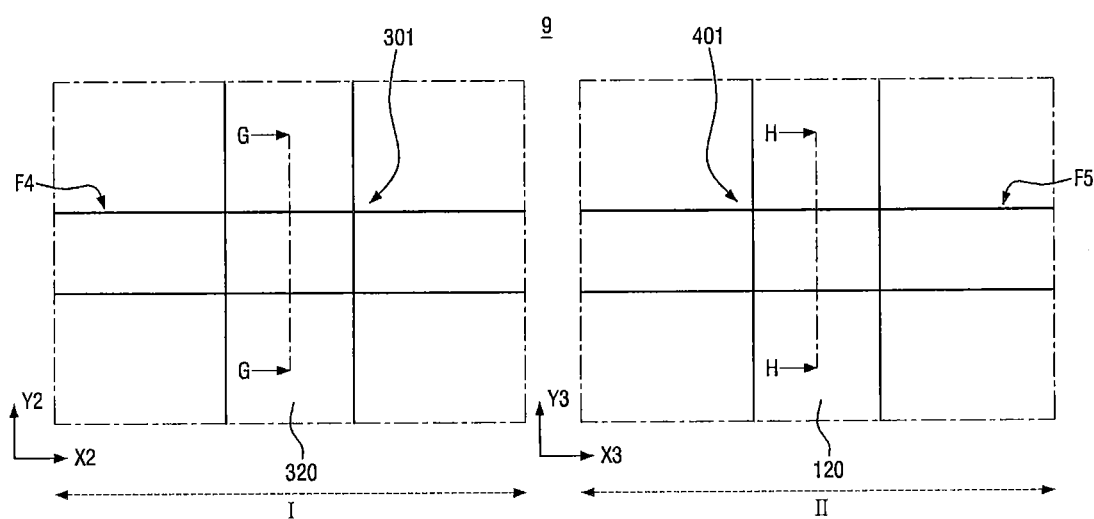
FIG. 20 is a layout view of a semiconductor device according to a ninth embodiment of the present inventive concept.
Figure 21:
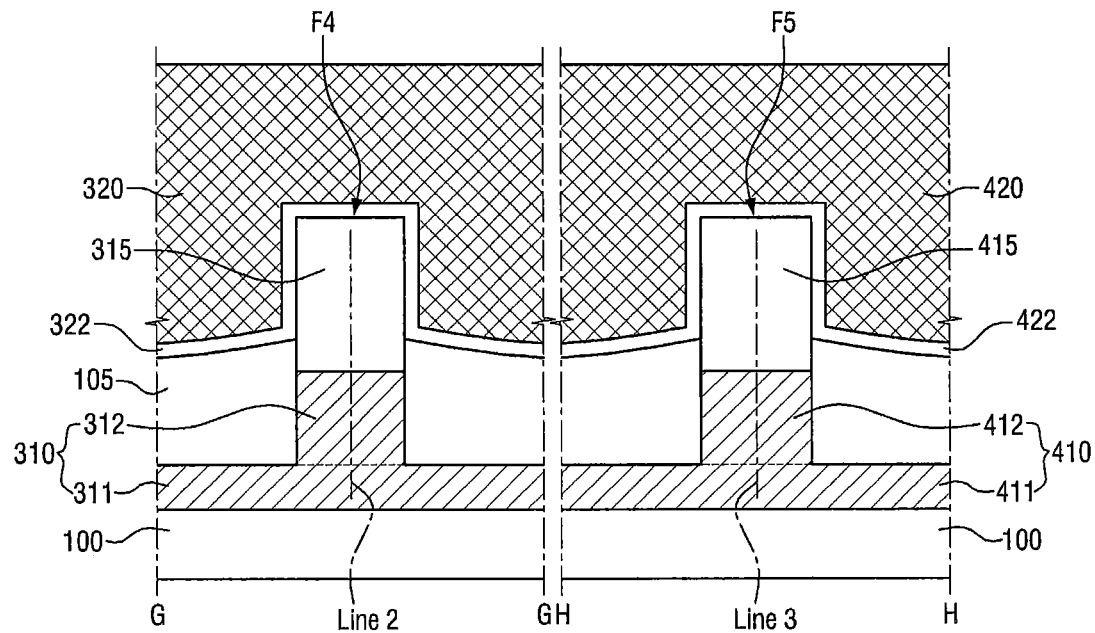
FIG. 21 is a cross-sectional view taken along the lines G-G and H-H of FIG. 20.
Figure 22:
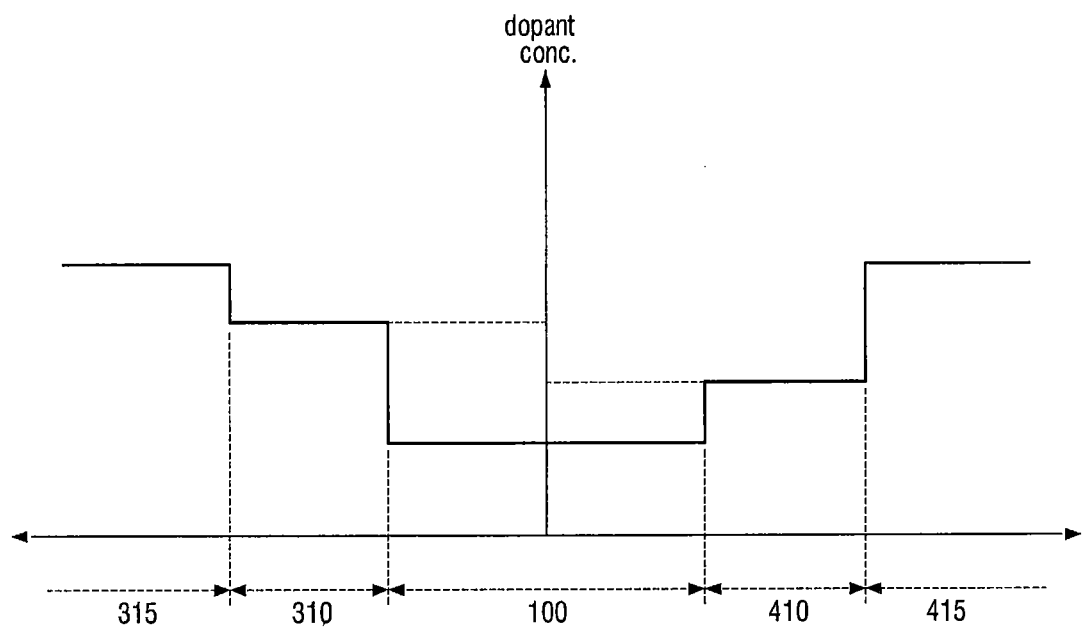
FIG. 22 is a schematic diagram illustrating dopant concentrations along Line 2 and Line 3 of FIG. 21.

FIG. 20 is a layout view of a semiconductor device 9 according to a ninth embodiment of the present inventive concept. FIG. 21 is a cross-sectional view taken along the lines G-G and H-H of FIG. 20. FIG. 22 is a schematic diagram illustrating dopant concentrations along Line 2 and Line 3 of FIG. 21.

For reference, while FIG. 21 shows a similar cross-section to FIG. 14, it can also have the same cross-section as FIG. 3.

Referring to FIGS. 20 and 21, the semiconductor device 9 according to the ninth embodiment of the present inventive concept may include a third heat-conducting layer 310, a fourth upper pattern 315, a third gate electrode 320, a fourth heat-conducting layer 410, a fifth upper pattern 415, and a fourth gate electrode 420.

A substrate 100 may include a first area I and a second area II. The first area I and the second area II may be separated from or connected to each other.

In the semiconductor device 9 according to the ninth embodiment of the present inventive concept, the first area I and the second area II of the substrate 100 may be areas in which transistors of different conductivity types are formed. That is, if the first area I of the substrate 100 is an area in which an N-type transistor is formed, the second area II of the substrate 100 may be an area in which a P-type transistor is formed. Conversely, if the first area I of the substrate 100 is an area in which a P-type transistor is formed, the second area II of the substrate 100 may be an area in which an N-type transistor is formed.

In the following description, it will be assumed that the first area I and the second area II of the substrate 100 are areas in which transistors of different conductivity types are formed.

A first transistor 301 may be formed in the first area I of the substrate 100. The first transistor 301 may include the third heat-conducting layer 310, the fourth upper pattern 315, and the third gate electrode 320.

The third heat-conducting layer 310 may be formed on the substrate 100. The third heat-conducting layer 310 may include a third base layer 311 and a fourth protruding pattern 312.

The fourth protruding pattern 312 may protrude from the third base layer 311. In addition, the fourth protruding pattern 312 may be directly connected to the third base layer 311. The fourth protruding pattern 312 may be located directly on the third base layer 311. The fourth protruding pattern 312 may extend along a third direction X2.

The fourth upper pattern 315 may be formed on the third heat-conducting layer 310. More specifically, the fourth upper pattern 315 may be formed on the fourth protruding pattern 312. Like the fourth protruding pattern 312, the fourth upper pattern 315 may extend along the third direction X2. The fourth upper pattern 315 may be directly connected to the fourth protruding pattern 312, but the present disclosure is not limited thereto.

A fourth fin pattern F4 may include the fourth upper pattern 315 and the fourth protruding pattern 312. For example, the fourth upper pattern 315 and the third heat-conducting layer 310 may include, but are not limited to, the same material.

A field insulating layer 105 may define the fourth fin pattern F4. The field insulating layer 105 may be formed on the third base layer 311. For example, the field insulating layer 105 may entirely cover sidewalls of the fourth protruding pattern 312.

Because at least part of the fourth fin pattern F4 protrudes farther upward than a top surface of the field insulating layer 105, at least part of the fourth upper pattern 315 may protrude farther upward than the top surface of the field insulating layer 105.

The third gate electrode 320 may extend along a fourth direction Y2 to intersect the fourth fin pattern F4. The third gate electrode 320 may be formed on the fourth fin pattern F4 and the field insulating layer 105.

A second transistor 401 may be formed in the second area II of the substrate 100. The second transistor 401 may include the fourth heat-conducting layer 410, the fifth upper pattern 415, and the fourth gate electrode 420.

Elements of the second transistor 401 are similar to those of the first transistor 301, and thus a description thereof will be omitted.

Referring to FIG. 22, a dopant concentration of the fourth upper pattern 315 may be greater than a dopant concentration of the third heat-conducting layer 310 and a dopant concentration of the substrate 100. The dopant concentration of the third heat-conducting layer 310 may be different from the dopant concentration of the substrate 100.

In addition, a dopant concentration of the fifth upper pattern 415 may be greater than a dopant concentration of the fourth heat-conducting layer 410 and the dopant concentration of the substrate 100. The dopant concentration of the fourth heat-conducting layer 410 may be different from the dopant concentration of the substrate 100.

Further, in the semiconductor device 9 according to the ninth embodiment of the present inventive concept, the dopant concentration profile of the third heat-conducting layer 310 may be different from the dopant concentration profile of the fourth heat-conducting layer 410.

Here, "different concentration profiles" may denote not only different magnitudes of dopant concentrations but also different types of dopant. In addition, "different concentration profiles" may denote different shapes in which a dopant is distributed in a heat-conducting layer (see FIGS. 7 through 10).

For example, the dopant concentration of the third heat-conducting layer 310 may be constant along a thickness direction of the third heat-conducting layer 310, and the dopant concentration of the fourth heat-conducting layer 410 may be constant along a thickness direction of the fourth heat-conducting layer 410.

Here, because a PMOS transistor is more vulnerable to heat than an NMOS transistor, the dopant concentration of the fourth heat-conducting layer 410 may be made to be less than the dopant concentration of the third heat-conducting layer 310. Accordingly, the thermal conductivity of the fourth heat-conducting layer 410 may be made to be greater than that of the third heat-conducting layer 310.

The dopant concentration of the third heat-conducting layer 310 and the dopant concentration of the fourth heat-conducting layer 410 have been described as being different from each other in a shape illustrated in FIG. 5. However, the present disclosure is not limited thereto. The dopant concentration profile of the third heat-conducting layer 310 and the dopant concentration profile of the fourth heat-conducting layer 410 can also be shaped as illustrated in FIGS. 5 through 10.

In addition, the third heat-conducting layer 310 and the fourth heat-conducting layer 410 may include different materials.

Figure 23:
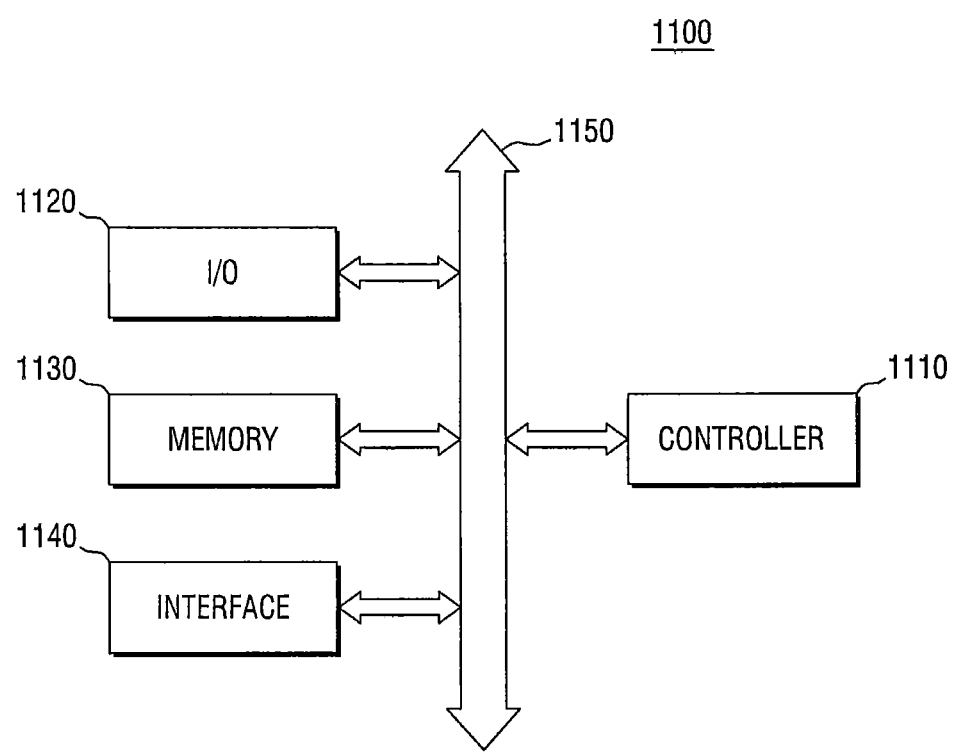
FIG. 23 is a block diagram of an electronic system including semiconductor devices according to embodiments of the present inventive concept.

FIG. 23 is a block diagram of an electronic system 1100 including semiconductor devices according to embodiments of the present inventive concept.

Referring to FIG. 23, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 114Q may be used to transmit data to or receive data from a communication network. The interface 1140 may be a wired or wireless interface. In an example, the interface 1140 may include an antenna or a wired or wireless transceiver. Although not illustrated in the drawing, the electronic system 1100 may be an operating memory for improving the operation of the controller 111Q, and may further include a high-speed DRAM or SRAM. Here, any one of the semiconductor devices 1 through 9 according to the above-described embodiments of the present inventive concept may be provided in the memory device 1130 or in the controller 1110 or the I/O device 1120.

The electronic system 1100 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

Figure 24:
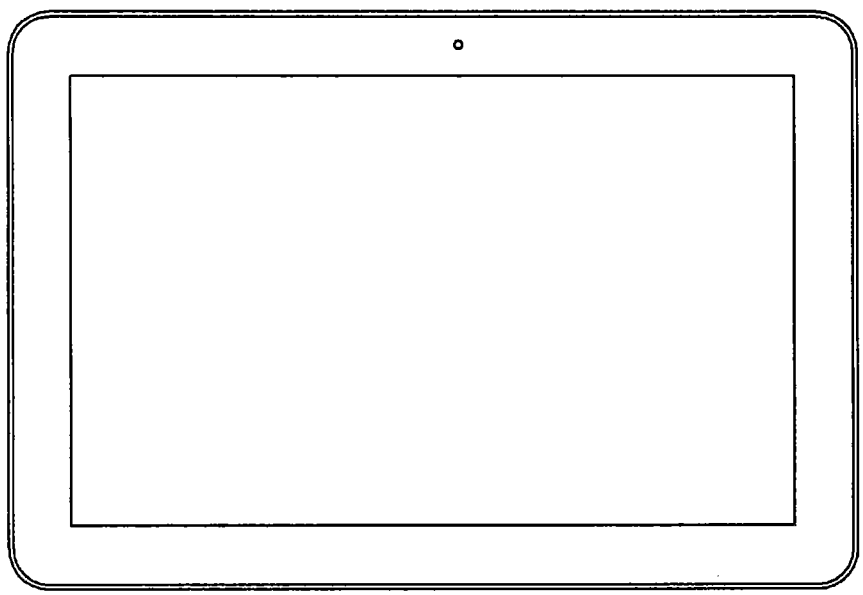
FIGS. 24 and 25 are example semiconductor systems to which semiconductor devices according to embodiments of the present inventive concept can be applied.
Figure 25:
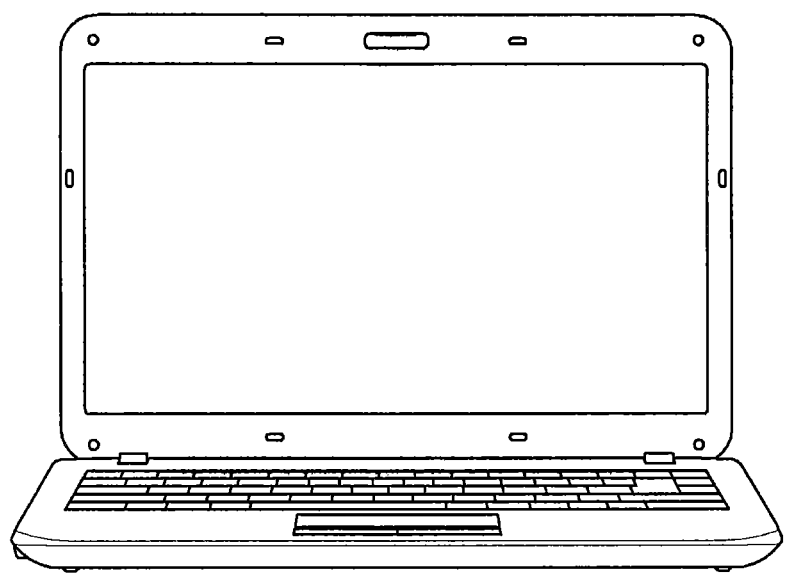

FIGS. 24 and 25 are diagrams illustrating examples of a semiconductor system to which semiconductor devices according to embodiments of the present inventive concept can be applied. FIG. 24 illustrates a tablet personal computer (PC), and FIG. 25 illustrates a notebook computer. At least one of the semiconductor devices 1 through 9 according to the above-described embodiments of the present inventive concept, as set forth herein, may be used in the tablet PC and the notebook computer. The semiconductor devices according to the embodiments of the present inventive concept, as set forth herein, may also be applied to various IC devices other than those set forth herein.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a first fin pattern comprises a first lower pattern and a first upper pattern stacked sequentially on a substrate;
a gate insulating layer that contacts the first upper pattern;
a gate electrode formed on the gate insulating layer to intersect the first fin pattern; and
source/drain regions formed on the first upper pattern on sides of the gate electrode, respectively,
wherein a dopant concentration of the first upper pattern is greater than a dopant concentration of the first lower pattern and a dopant concentration of the substrate, and the dopant concentration of the first lower pattern is different from the dopant concentration of the substrate.

2. The semiconductor device of claim 1, wherein the dopant concentration of the first lower pattern is substantially constant along a thickness direction of the first lower pattern.

3. The semiconductor device of claim 2, wherein the dopant concentration of the first lower pattern is greater than the dopant concentration of the substrate.

4. The semiconductor device of claim 1, wherein the first upper pattern and the first lower pattern have the same conductivity type.

5. The semiconductor device of claim 1, wherein the first upper pattern and the first lower pattern comprise the same material.

6. The semiconductor device of claim 1, wherein the semiconductor device comprises a p-channel metal oxide semiconductor transistor; and
wherein a lattice constant of a material comprising the source/drain regions is greater than a lattice constant of a material comprising the first fin pattern.

7. The semiconductor device of claim 1, wherein the semiconductor device comprises an n-channel metal oxide semiconductor transistor; and
wherein a lattice constant of a material comprising the source/drain regions is less than a lattice constant of a material comprising the first fin pattern.

8. A semiconductor device comprising:
a first fin pattern comprises a first lower pattern and a first upper pattern stacked sequentially on a substrate, the first upper pattern comprising a first part and second parts respectively disposed on sides of the first part;
a gate electrode formed on the first part to intersect the first fin pattern; and
source/drain regions formed on the second parts, respectively,
wherein each of the source/drain regions comprises an epitaxial layer disposed on the first upper pattern on sides of the gate electrode,
wherein the epitaxial layer contacts a side surface of the first upper pattern,
wherein a dopant concentration of the first upper pattern is greater than a dopant concentration of the first lower pattern and a dopant concentration of the substrate, and the dopant concentration of the first lower pattern is different from the dopant concentration of the substrate.

9. The semiconductor device of claim 8, wherein the dopant concentration of the first lower pattern is substantially constant along a thickness direction of the first lower pattern.

10. The semiconductor device of claim 9, wherein the dopant concentration of the first lower pattern is greater than the dopant concentration of the substrate.

11. The semiconductor device of claim 8, wherein the first upper pattern and the first lower pattern have the same conductivity type.

12. The semiconductor device of claim 8, wherein the first upper pattern and the first lower pattern comprise the same material.

* * * * *